US011846658B2

(12) United States Patent
Qi et al.

(10) Patent No.: US 11,846,658 B2
(45) Date of Patent: Dec. 19, 2023

(54) HIGH PRECISION CURRENT SAMPLING CIRCUIT WITH ON-CHIP REAL-TIME CALIBRATION

(71) Applicant: X-SIGNAL INTEGRATED CO., LTD., Beijing (CN)

(72) Inventors: Wei Qi, Beijing (CN); Nailong Wang, Beijing (CN)

(73) Assignee: X-SIGNAL INTEGRATED CO., LTD., Beijing (CN)

( * ) Notice: Subject to any disclaimer, the term of this patent is extended or adjusted under 35 U.S.C. 154(b) by 0 days.

(21) Appl. No.: 18/228,012

(22) Filed: Jul. 31, 2023

(65) Prior Publication Data

US 2023/0375598 A1    Nov. 23, 2023

Related U.S. Application Data

(63) Continuation of application No. PCT/CN2022/087661, filed on Apr. 19, 2022.

(30) Foreign Application Priority Data

May 13, 2021   (CN) .......................... 202110520954.5

(51) Int. Cl.
  *G01R 27/14*  (2006.01)
  *G01R 19/00*  (2006.01)
  *G01R 35/00*  (2006.01)
(52) U.S. Cl.
  CPC ......... *G01R 19/0092* (2013.01); *G01R 27/14* (2013.01); *G01R 35/007* (2013.01)

(58) Field of Classification Search
  CPC ......... G01R 19/00; G01R 27/14; G01R 35/00
  See application file for complete search history.

(56) References Cited

U.S. PATENT DOCUMENTS

| 6,603,356 B1 * | 8/2003 | Kim ........................ H03F 1/308 |
| | | 330/265 |
| 2014/0321195 A1 * | 10/2014 | Antonyan ........... G11C 11/1697 |
| | | 365/148 |

(Continued)

FOREIGN PATENT DOCUMENTS

| CN | 101629973 A | 1/2010 |
| CN | 101666824 A | 3/2010 |

(Continued)

*Primary Examiner* — Dominic E Hawkins
(74) *Attorney, Agent, or Firm* — Bayramoglu Law Offices LLC

(57) ABSTRACT

A current sampling circuit with on-chip real-time calibration is used to detect the on-state current of a driving transistor. The current sampling circuit includes a first resistor, a second resistor, a voltage sampling circuit, a sampling voltage operational circuit and an on-state resistance calibration circuit. The voltage sampling circuit is used to obtain on-state voltage drop value of the driving transistor Vds. The on-state resistance calibration circuit includes a reference current source and a calibrating transistor. On-state resistance value of the calibrating transistor is set to be K1 times of on-state resistance value of the driving transistor. The on-state voltage drop value Vds obtained by the voltage sampling circuit and the on-voltage drop value of the calibrating transistor Vrsns are input to the sampling voltage operational circuit to obtain proportional relationship K2 between the on-state voltage drop value Vds and the on-state voltage drop value Vrsns.

18 Claims, 3 Drawing Sheets

(56) References Cited

U.S. PATENT DOCUMENTS

2017/0363662 A1   12/2017  Neidorff
2018/0123383 A1\*  5/2018  Tian .................. H02M 3/33523

FOREIGN PATENT DOCUMENTS

| CN | 105763047 A | 7/2016 |
| CN | 107765067 A | 3/2018 |
| CN | 107817868 A | 3/2018 |
| CN | 110943612 A | 3/2020 |
| CN | 113252949 A | 8/2021 |

\* cited by examiner

HIGH PRECISION CURRENT SAMPLING CIRCUIT WITH ON-CHIP REAL-TIME CALIBRATION

CROSS REFERENCE TO THE RELATED APPLICATIONS

This application is the continuation application of International Application No. PCT/CN2022/087661, filed on Apr. 19, 2022, which is based upon and claims priority to Chinese Patent Application No. 202110520954.5, filed on May 13, 2021, the entire contents of which are incorporated herein by reference.

TECHNICAL FIELD

The present invention relates to the technical field of power management circuit, specifically to a high precision current sampling circuit with on-chip real-time calibration.

BACKGROUND

Current sampling circuit is indispensable in power management chip, power control chip, and solid state lighting chip. However, in the application of DC motor driving circuit, there is stringent requirement for power consumption, accuracy, speed and cost. High cost and poor performance of existing current sampling circuit make it difficult to meet the increasingly stringent demand for low cost and high performance application.

Traditional current sampling techniques include: resistive sampling, SENSEFET sampling, DCR (Direct Current Resistance) sampling, integrator sampling, and dynamic bias feedback sampling. Among them, three common type samplings are: (1) resistance sampling: current sampling is achieved through resistors connected in series and detection of the voltage drop across the resistors. Resistor sampling is relatively simple and easy to implement, but resistor will lead to additional power consumption, thus reduce efficiency of the system. (2) SENSEFET sampling: through a mirror tube which has proportional size to that of the power tube, and by making electric potential be same at three ends of the mirror tube and the power tube, current on a power tube is sampled out proportionally. In this sampling method, matching issue of the power tube and the mirror tube should be noticed, and when layout is designed, it should be ensured that the power tube and the mirror tube have same gate width to prevent different threshold voltage and other problems caused by different gate width. (3) DCR sampling: current information of an inductor is obtained by connecting a capacitor and a resistor in parallel to the inductor and using voltage drop across inductor equivalent resistor. However, in practical case of this implementation method, time constant in the RC branch is closely related to parameters of the inductor, the capacitor and the resistor, so it is difficult to match the time constants of two branches, and this method is deficient in integration term.

FIG. 1 shows a schematic diagram of a current acquisition circuit applying resistor sampling in the prior art, which is simple and easy to implement, and circuit design requirement is less difficult. However, adding additional high precision sampling resistor is required, while the high precision sampling resistor needs to be designed as a separate device from the integrated circuit chip. Therefore, additional sampling pins are required in chip design stage, which will result in increase in device cost. Moreover, the high precision sampling resistor will cause large power consumption, which is unacceptable in low power application.

SUMMARY

Based on analysis of the principle and shortcomings of the existing resistor sampling circuit, the present invention proposes a method that can achieve high precision sampling of on-chip current in both positive direction and negative direction by calibrating on-state resistance of the on-chip driving tube in real time without relying on off-chip devices, and at the same time can protect the chip when voltage is negative from damage to the chip caused by latch-up effect inside the chip. This enables precise control of the DC motor driving current and improves reliability.

In view of this, the present invention provides a current sampling circuit with on-chip real-time calibration. The current sampling circuit is used to detect on-state current of a driving transistor, and includes a first resistor, a second resistor, a voltage sampling circuit, a sampling voltage operational circuit and an on-state resistance calibration circuit;

The voltage sampling circuit is used for obtaining on-state voltage drop value of the driving transistor Vds;

The on-state resistance calibration circuit includes a reference current source and a calibrating transistor;

On-state resistance value of the calibrating transistor is set to be K1 times of on-state resistance value of the driving transistor.

The on-state voltage drop value of the driving transistor Vds obtained by the voltage sampling circuit and the on-state voltage drop value of the calibrating transistor Vrsns are input to the sampling voltage operational circuit so as to obtain a proportional relationship K2 between the on-state voltage drop value of the driving transistor Vds and the on-state voltage drop value of the calibrating transistor Vrsns;

When current value of the reference current source is Iref, on-state current of the driving transistor Ids is: Ids=K1×K2×Iref.

Optionally, in the current sampling circuit with on-chip real-time calibration provided by the present invention, the first resistor and the second resistor both have a resistance value of R, and the relationship of current flowing through the first resistor I1 and the on-state voltage drop of the driving transistor Vds satisfies:

$$I1 = \frac{Vds}{R}.$$

Optionally, in the current sampling circuit with on-chip real-time calibration provided by the present invention, the voltage sampling circuit includes a first current mirror including a first transistor and a second transistor; the voltage sampling circuit further includes a second current mirror including a third transistor and a fourth transistor.

Optionally, in the current sampling circuit with on-chip real-time calibration provided by the present invention, a drain of the first transistor is connected to one end of a first resistor, and the other end of the first resistor is connected to a drain of the driving transistor; a drain of the second transistor is connected to one end of a second resistor, and the other end of the second resistor is connected to a source of the driving transistor.

Optionally, in the current sampling circuit with on-chip real-time calibration provided by the present invention, the voltage sampling circuit further includes an operational amplifier. A non-inverting input of the operational amplifier is connected to the drain of the first transistor and an inverting input of the operational amplifier is connected to the drain of the second transistor.

Optionally, in the current sampling circuit with on-chip real-time calibration provided by the present invention, the voltage sampling circuit further includes a modulating transistor, a gate of the modulating transistor is connected to an output of the operational amplifier, a source of the modulating transistor is connected to a drain of a third transistor, a drain of the modulating transistor is connected to a drain of a second transistor; a drain of the fourth transistor is connected to one end of a third resistor, and the other end of the third resistor is grounded. At the same time, voltage difference value of a third resistor Vsns is input to the sampling voltage operational circuit.

Optionally, in the current sampling circuit with on-chip real-time calibration provided by the present invention, the first resistor, the second resistor and the third resistor all have a resistance value R.

Optionally, in the current sampling circuit with on-chip real-time calibration provided by the present invention, by adjusting current value provided by the reference current source, proportional relationship K2 between the on-state voltage drop value of the driving transistor Vds and the on-state voltage drop value of the calibrating transistor Vrsns is 1, such that the on-state current of the driving transistor Ids is:

$$Ids = K1 \times Iref.$$

Optionally, in the current sampling circuit with on-chip real-time calibration provided by the present invention, the calibrating transistor and the driving transistor are designed to be adjacent to each other during design of integrated electrical layout, thereby ensuring that the calibrating transistor and the driving transistor have same process angle and same operating temperature.

Optionally, another aspect of the present invention lies in providing a power control circuit, in which the aforementioned current sampling circuit with on-chip real-time calibration is used.

The point of invention according to the present invention lies in the following aspects:
1. The present invention proposes the use of an on-state resistance calibration circuit to calibrate the on-state resistance of the driving transistor to obtain actual value of the on-state resistance of the driving transistor, which results in a significant increase in measurement accuracy of the on-state current of the driving transistor.
2. In the present invention, it is proposed to reasonably set first resistor resistance value and relationship between current of the first resistor I1 and on-state voltage drop of the driving transistor Vds, thereby protect the current sampling circuit when negative on-state voltage is act on the driving transistor, and avoid damage to the chip caused by latch-up effect inside the chip.

BRIEF DESCRIPTION OF THE DRAWINGS

The features and advantages of the present invention will be more clearly understood by reference to the accompanying drawings, which are schematic and should not be construed as limiting the invention in any way, in which.

DETAILED DESCRIPTION OF THE EMBODIMENTS

In order to make the purpose, technical solutions and advantages of the embodiments of the present invention clearer, the technical solutions in the embodiments of the present invention will be described clearly and completely below in conjunction with the accompanying drawings in the embodiments of the present invention, and it is clear that the embodiments described are part of the embodiments of the present invention and not all of them. Based on the embodiments in the present invention, all other embodiments obtained without creative labor by a person skilled in the art fall within the scope of protection of the present invention.

Figure 1:
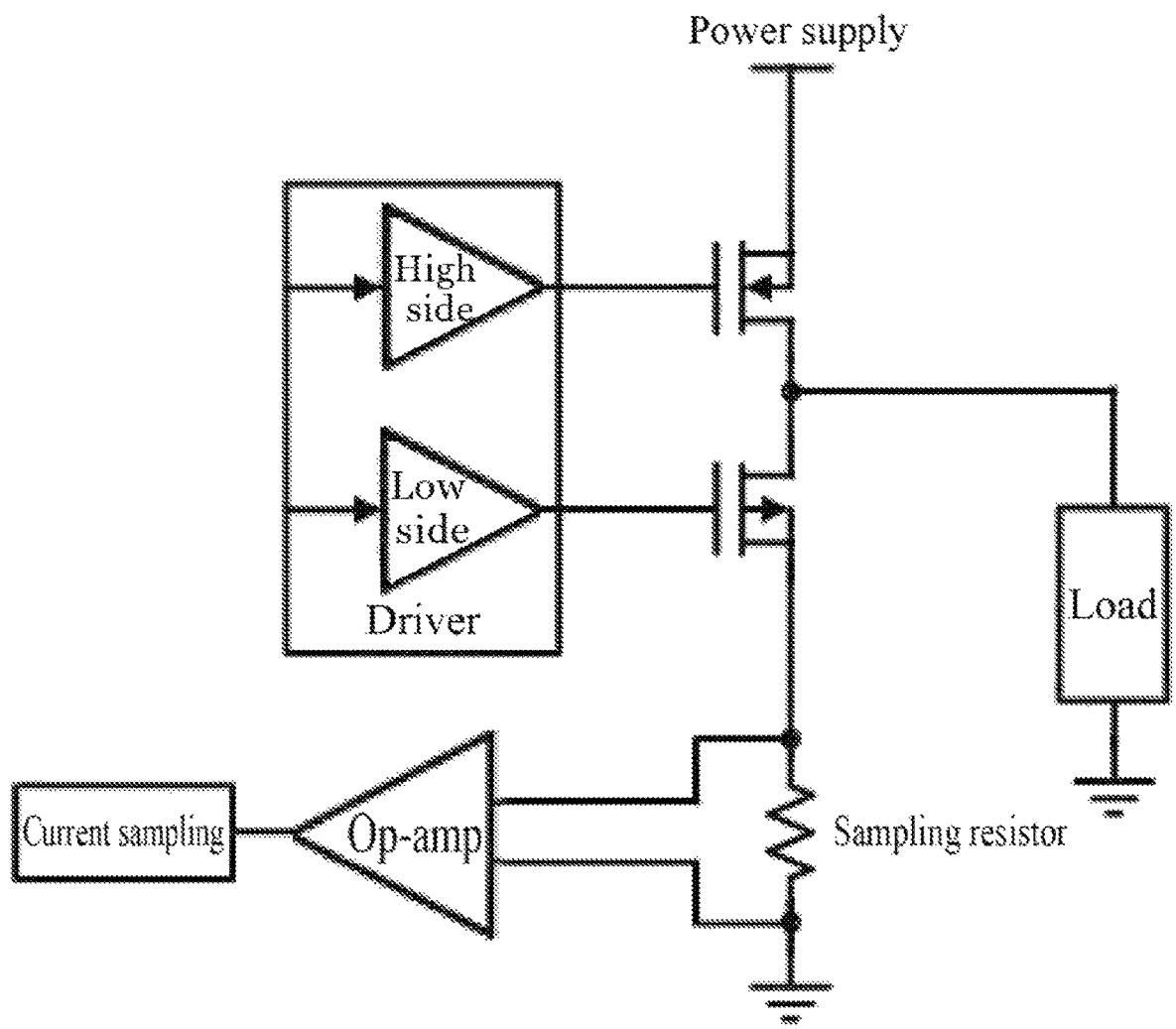
FIG. 1 illustrates a schematic structure diagram of a current sampling circuit of the resistance sampling type of the prior art.
Figure 2:
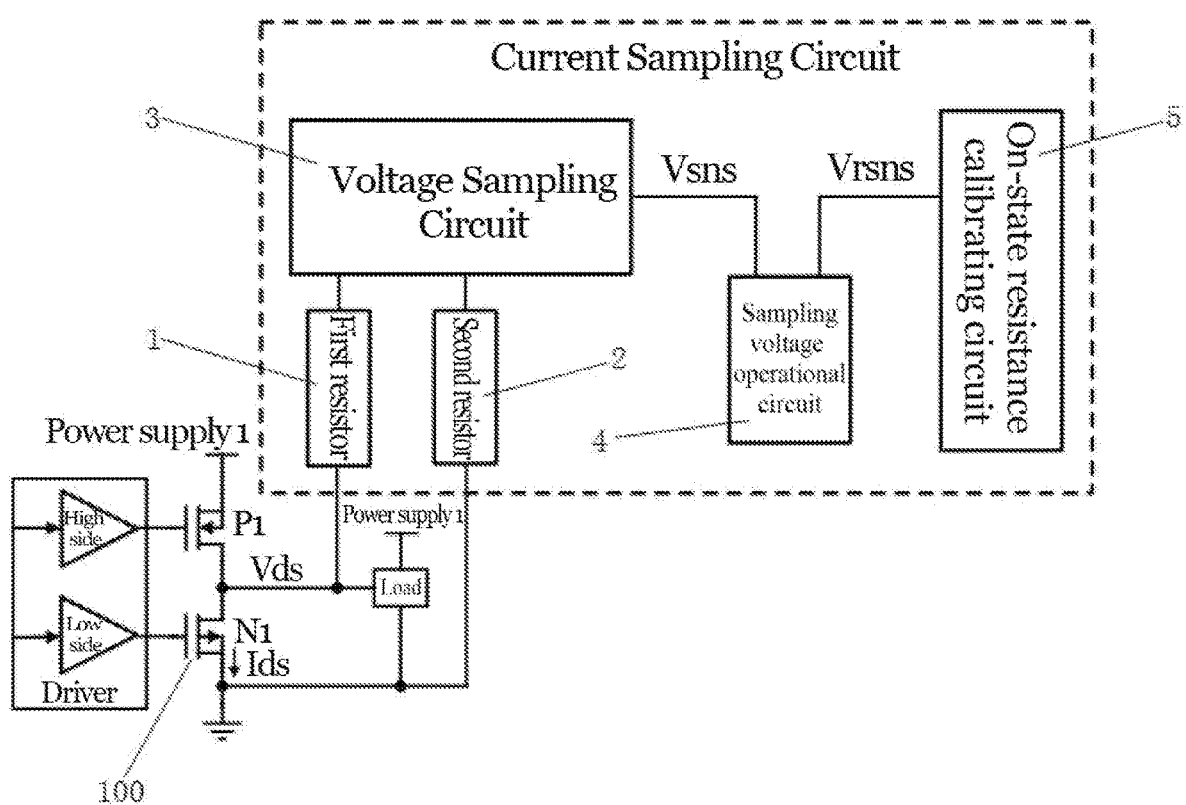
FIG. 2 illustrates a schematic structure diagram of a current sampling circuit of an embodiment of the present invention.

FIG. 2 illustrates a schematic structure diagram of a current sampling circuit according to an embodiment of the present invention. The current sampling circuit of the embodiment includes a first resistor 1, a second resistor 2, a voltage sampling circuit 3, a sampling voltage operational circuit 4 and an on-state resistance calibration circuit 5. The current sampling circuit is connected between a source and a drain of a driving transistor 100, so as to detect the current Ids flowing through the driving transistor 100.

Figure 3:
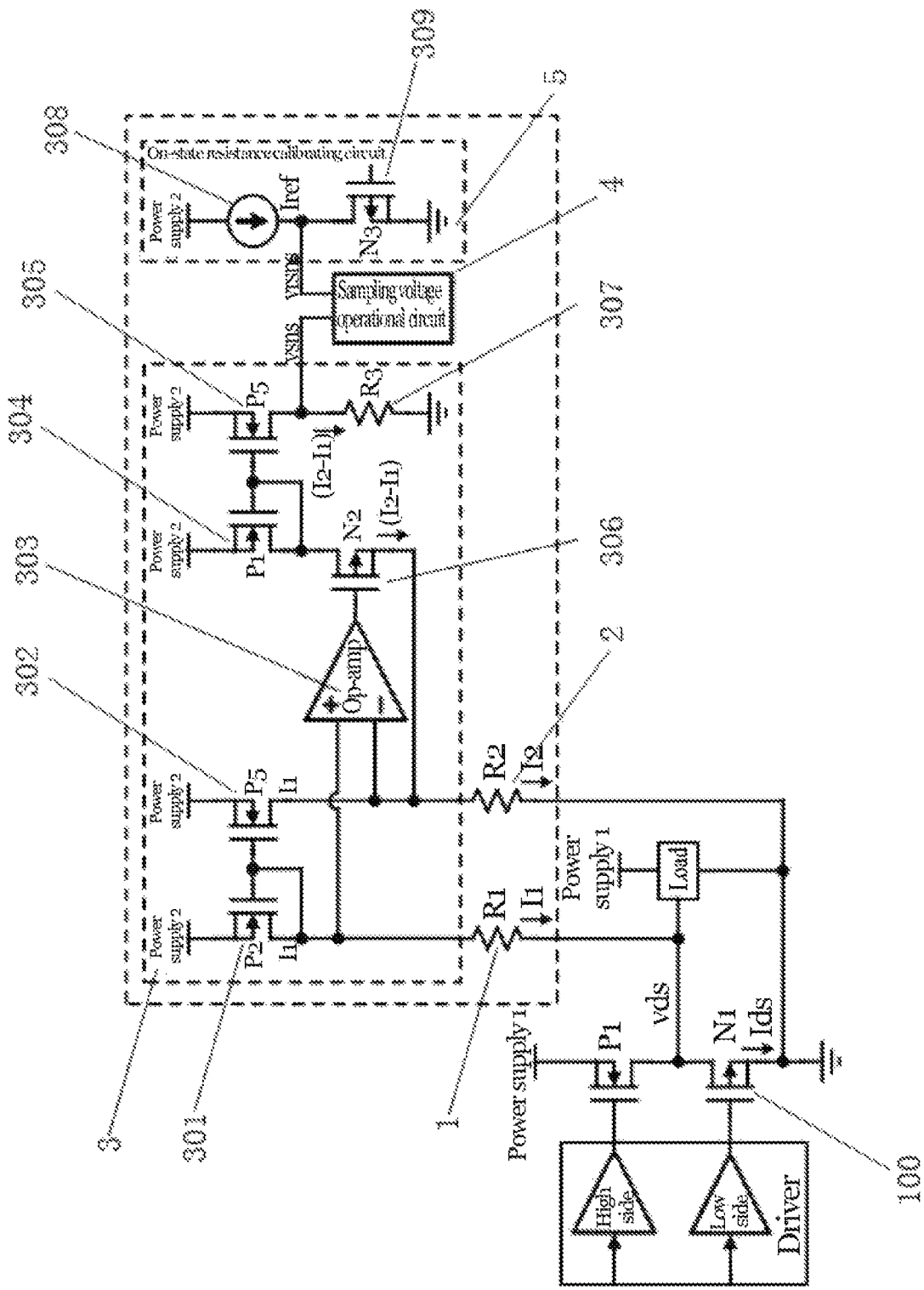
FIG. 3 illustrates a schematic circuit diagram of a current sampling circuit of an embodiment of the present invention.

FIG. 3 illustrates a schematic circuit diagram of a current sampling circuit of an embodiment of the present invention. The voltage sampling circuit 3 in the embodiment includes a first current mirror including a first transistor 301 and a second transistor 302. Specifically, gates of the first transistor 301 and the second transistor 302 are interconnected, sources of the first transistor 301 and the second transistor 302 are connected to an external power supply, while a drain of the first transistor 301 is connected to a gate of its own, a drain of the first transistor 301 is connected to one end of the first resistor 1, and the other end of the first resistor 1 is connected to a drain of the driving transistor. A drain of the second transistor 302 is connected to one end of the second resistor 2, and the other end of the second resistor 2 is connected to a source of the driving transistor. Mirror current generated on both sides of the first current mirror in this embodiment is I1, and current flowing through the first resistor 1 is I1 and current flowing through the second resistor 2 is I2.

The voltage sampling circuit further includes an operational amplifier 303. A non-inverting input of the operational amplifier 303 is connected to the drain of the first transistor 301, and an inverting input of the operational amplifier 303 is connected to the drain of the second transistor 302.

The voltage sampling circuit 3 in the embodiment further includes a second current mirror including a third transistor 304 and a fourth transistor 305. Specifically, gates of the third transistor 304 and the fourth transistor 305 are interconnected, and sources of the third transistor 304 and the fourth transistor 305 are connected to an external power supply, while a drain of the third transistor 304 is connected to a gate of its own.

The voltage sampling circuit 3 in the embodiment further includes a modulating transistor 306. A gate of the modulating transistor 306 is connected to an output of the operational amplifier 303, a source of the modulating transistor 306 is connected to a drain of the third transistor 304, and a drain of the modulating transistor 306 is connected to a drain of the second transistor 302. A drain of the fourth transistor 305 is connected to one end of a third resistor 307, and the other end of the third resistor 307 is grounded. At the same time, voltage difference value Vsns of the third resistor 307 is input to the sampling voltage operational circuit 4.

The on-state resistance calibration circuit 5 in the embodiment includes a reference current source 308 and a calibrating transistor 309. The reference current source 308 is connected to an external power supply and generates a current Iref input to a source of the calibrating transistor 309. A gate of the calibrating transistor 309 is connected to a gate of the driving transistor 100, and a drain of the calibrating transistor 309 is grounded. Source voltage value Vrsns of the calibrating transistor 309 is input to the sampling voltage operational circuit 4.

In the embodiment, voltage difference between the non-inverting input and the inverting input of the operational amplifier 303 is on-state voltage drop of the driving transistor Vds. When the on-state voltage drop of the driving transistor Vds is not zero, the operational amplifier 303 will modulate the modulating transistor 306, to generate on-state current at the drain of the modulating transistor 306 with current value of I1–I2. When the resistance values of the first resistor 1, the second resistor 2 and the third resistor 307 are all set to R, the on-state current I1–I2 generated by the modulating transistor 306 can be expressed as:

$$I2 - I1 = \frac{Vds}{R}.$$

Because of the current mirror structure including the third transistor 304 and the fourth transistor 305, current flowing through the third resistor 307 is also I1-I2, then voltage difference value Vsns of the third resistor 307 can be expressed as:

$$Vsns=(I2-I1)\times R.$$

Then it is obtained: Vds=Vsns.

According to the relevant structural characteristics of the transistor, it is known that on-state resistance of the driving transistor 100 varies with process angle and temperature, and error is large if on-state current of it is calculated based on the on-state resistance calibrated by the driving transistor. In the embodiment, in order to calibrate the on-state resistance of the driving transistor accurately, a reference current source 308 and a calibrating transistor 309 are provided in the on-state resistance calibration circuit 5, wherein the on-state resistance of the calibrating transistor 309 is designed to be K1 times of the on-state resistance of the driving transistor 100. Specifically, when an integrated electrical layout is designed, the driving transistor 100 and the calibrating transistor 309 are designed to be adjacent to each other, and the on-state resistance of the calibrating transistor 309 is designed to be K1 times of the on-state resistance of the driving transistor 100 by adjusting design parameters. This ensures that the calibrating transistor 309 and the driving transistor 100 have same process angle and same operating temperature, therefore, it is achieved that the on-state resistance of the calibrating transistor 309 is always kept as to be K1 times of the on-state resistance of the driving transistor 100. At this point, if the on-state resistance of the driving transistor 100 is Rdson, the voltage Vrsns generated by the current Iref flowing through the calibrating transistor 309 from the reference current source 308 can be expressed as:

$$Vrsns=Iref\times K1\times Rdson.$$

In the embodiment, the proportional relationship K2 between Vsns and Vrsns is obtained by the sampling voltage operational circuit 4, i.e.:

$$K2 = \frac{Vsns}{Vrsns},$$

and then according to:

$$Ids = \frac{Vds}{Rdson},$$

finally, the expression for Ids is obtained as:

$$Ids=K1\times K2\times Iref.$$

Thus, the sampling of the on-state current Ids of the driving transistor 100 is completed.

In the circuit structure of the embodiment, when the driving transistor 100 drives the load, because negative current will be generated when the load is operated, inverting voltage will be generated at drain-source of the driving transistor 100, and source of the driving transistor 100 is connected. Therefore, Vds is negative at this time, and if there is no protection, this negative voltage will create latch-up effect inside the chip, which will further damage the chip.

In the sampling circuit of the present invention, this situation is taken into account, that is, when the sampling is completed, the chip is protected internally against negative voltages at the same time, and thus chip damage is avoided. This is specially done as follows: a suitable current value I1 and resistance values R of the first resistor 1 and the second resistor 2 are selected according to the amplitude of the negative voltage, such that:

$$I1 = \frac{Vds}{R}.$$

Therefore, the voltages at the two inputs of the first resistor 1 and the second resistor 2 connected to the operational amplifier 303 are set to be positive, such that the circuit inside the chip will not be connected to a negative voltage, i.e. no latch-up effect will occur so as to avoid damage to the chip, thus achieving protection of the chip in case of negative voltage.

Although embodiments of the invention are described in connection with the accompanying drawings, various modifications and variations can be made by those skilled in the art without departing from the spirit and scope of the invention, and such modifications and variations fall within the scope defined by the appended claims.

What is claimed is:

1. A current sampling circuit with on-chip real-time calibration, wherein the current sampling circuit is used for detecting on-state current of a driving transistor, and the current sampling circuit comprises:

a first resistor, a second resistor, a voltage sampling circuit, a sampling voltage operational circuit and an on-state resistance calibration circuit;

the voltage sampling circuit is used to obtain on-state voltage drop value of the driving transistor Vds;

the on-state resistance calibration circuit comprises a reference current source and a calibrating transistor;

on-state resistance value of the calibrating transistor is set to be K1 times of on-state resistance value of the driving transistor;

the on-state voltage drop value of the driving transistor Vds obtained by the voltage sampling circuit and on-state voltage drop value of the calibrating transistor Vrsns are input to the sampling voltage operational circuit to obtain a proportional relationship K2 between the on-state voltage drop value of the driving transistor Vds and the on-state voltage drop value of the calibrating transistor Vrsns;

and when a current value of the reference current source is Iref, on-state current of the driving transistor Ids is: Ids=K1×K2×Iref.

2. The current sampling circuit with the on-chip real-time calibration according to claim 1, wherein a resistance value of each of the first resistor and the second resistor is R, and a relationship between a current flowing through the first resistor I1 and the on-state voltage drop value of the driving transistor Vds satisfies:

$$I1 = \frac{Vds}{R}.$$

3. The current sampling circuit with the on-chip real-time calibration according to claim 2, wherein the voltage sampling circuit comprises a first current mirror comprising a first transistor and a second transistor; further comprises a second current mirror comprising a third transistor and a fourth transistor.

4. The current sampling circuit with the on-chip real-time calibration according to claim 3, wherein a drain of the first transistor is connected to one end of the first resistor, and the other end of the first resistor is connected to a drain of the driving transistor; a drain of the second transistor is connected to one end of a second resistor, and the other end of the second resistor is connected to a source of the driving transistor.

5. The current sampling circuit with the on-chip real-time calibration according to claim 4, wherein the voltage sampling circuit further comprises an operational amplifier, wherein a non-inverting input of the operational amplifier is connected to the drain of the first transistor, and an inverting input of the operational amplifier is connected to the drain of the second transistor.

6. The current sampling circuit with the on-chip real-time calibration according to claim 5, wherein the voltage sampling circuit further comprises a modulating transistor, wherein a gate of the modulating transistor is connected to an output of the operational amplifier, a source of the modulating transistor is connected to a drain of the third transistor, a drain of the modulating transistor is connected to a drain of the second transistor; a drain of the fourth transistor is connected to one end of a third resistor, and the other end of the third resistor is grounded; while a voltage difference value of the third resistor Vsns is input to the sampling voltage operational circuit.

7. The current sampling circuit with the on-chip real-time calibration according to claim 6, wherein a resistance value of each of the first resistor, the second resistor and the third resistor is R.

8. The current sampling circuit with the on-chip real-time calibration according to claim 1, wherein a current value provided by the reference current source is adjusted such that the proportional relationship K2 between the on-state voltage drop value of the driving transistor Vds and the on-state voltage drop value of the calibrating transistor Vrsns is 1, so that the on-state current of the driving transistor Ids is:

$$Ids=K1\times Iref.$$

9. The current sampling circuit with the on-chip real-time calibration according to claim 1, wherein the calibrating transistor and the driving transistor are designed to be adjacent to each other when an integrated electrical layout is designed, so as to ensure that the calibrating transistor and the driving transistor have same process angle and same operating temperature.

10. A power control circuit, wherein the power control circuit uses the current sampling circuit with the on-chip real-time calibration according to claim 1.

11. The power control circuit according to claim 10, wherein in the current sampling circuit with the on-chip real-time calibration, a resistance value of each of the first resistor and the second resistor is R, and a relationship between a current flowing through the first resistor I1 and the on-state voltage drop value of the driving transistor Vds satisfies:

$$I1 = \frac{Vds}{R}.$$

12. The power control circuit according to claim 11, wherein in the current sampling circuit with the on-chip real-time calibration, the voltage sampling circuit comprises a first current mirror comprising a first transistor and a second transistor; further comprises a second current mirror comprising a third transistor and a fourth transistor.

13. The power control circuit according to claim 12, wherein in the current sampling circuit with the on-chip real-time calibration, a drain of the first transistor is connected to one end of the first resistor, and the other end of the first resistor is connected to a drain of the driving transistor; a drain of the second transistor is connected to one end of a second resistor, and the other end of the second resistor is connected to a source of the driving transistor.

14. The power control circuit according to claim 13, wherein in the current sampling circuit with the on-chip real-time calibration, the voltage sampling circuit further comprises an operational amplifier, wherein a non-inverting input of the operational amplifier is connected to the drain of the first transistor, and an inverting input of the operational amplifier is connected to the drain of the second transistor.

15. The power control circuit according to claim 14, wherein in the current sampling circuit with the on-chip real-time calibration, the voltage sampling circuit further comprises a modulating transistor, wherein a gate of the modulating transistor is connected to an output of the operational amplifier, a source of the modulating transistor is connected to a drain of the third transistor, a drain of the modulating transistor is connected to a drain of the second transistor; a drain of the fourth transistor is connected to one end of a third resistor, and the other end of the third resistor is grounded; while a voltage difference value of the third resistor Vsns is input to the sampling voltage operational circuit.

16. The power control circuit according to claim 15, wherein in the current sampling circuit with the on-chip real-time calibration, a resistance value of each of the first resistor, the second resistor and the third resistor is R.

17. The power control circuit according to claim 10, wherein in the current sampling circuit with the on-chip real-time calibration, a current value provided by the reference current source is adjusted such that the proportional relationship K2 between the on-state voltage drop value of the driving transistor Vds and the on-state voltage drop value of the calibrating transistor Vrsns is 1, so that the on-state current of the driving transistor Ids is:

$Ids = K1 \times Iref.$

18. The power control circuit according to claim 10, wherein in the current sampling circuit with the on-chip real-time calibration, the calibrating transistor and the driving transistor are designed to be adjacent to each other when an integrated electrical layout is designed, so as to ensure that the calibrating transistor and the driving transistor have same process angle and same operating temperature.

\* \* \* \* \*